(12) United States Patent
You et al.

(10) Patent No.: US 9,390,966 B2
(45) Date of Patent: Jul. 12, 2016

(54) METHODS OF FORMING WIRING STRUCTURES AND METHODS OF FABRICATING SEMICONDUCTOR DEVICES

(71) Applicant: Samsung Electronics Co., Ltd., Suwon-si (KR)

(72) Inventors: Woo-Kyung You, Suwon-si (KR); Sang-Ho Rha, Seongnam-si (KR); Jong-Min Baek, Suwon-si (KR); Sang-Hoon Ahn, Goyang-si (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/516,774

(22) Filed: Oct. 17, 2014

(65) Prior Publication Data

US 2015/0194333 A1    Jul. 9, 2015

(30) Foreign Application Priority Data

Jan. 6, 2014 (KR) .................. 10-2014-0001297

(51) Int. Cl.
*H01L 21/768* (2006.01)
*H01L 21/3065* (2006.01)
*H01L 21/764* (2006.01)

(52) U.S. Cl.
CPC ........ *H01L 21/7682* (2013.01); *H01L 21/3065* (2013.01); *H01L 21/764* (2013.01); *H01L 21/76826* (2013.01); *H01L 21/76849* (2013.01); *H01L 21/76877* (2013.01)

(58) Field of Classification Search
CPC ..................... H01L 21/7682; H01L 21/76832; H01L 21/76849; H01L 21/76831; H01L 21/76834; H01L 21/76826; H01L 21/76811; H01L 21/76843; H01L 21/76807; H01L 23/53295; H01L 21/0206; H01L 21/02063; H01L 21/281; H01L 21/3086; H01L 21/31116; H01L 21/31144; H01L 21/32137; H01L 21/32139; H01L 21/76802; H01L 21/764; H01L 21/76897; H01L 23/53223; H01L 23/53238; H01L 23/53266; H01L 21/76877; H01L 21/3065; H01L 29/4991; H01L 29/0649; H01L 21/76841; B81C 2203/0136
USPC .................................. 438/619, 652, 653, 672
See application file for complete search history.

(56) References Cited

U.S. PATENT DOCUMENTS

| | | |
|---|---|---|
| 6,265,321 B1 | 7/2001 | Chooi et al. |
| 6,562,190 B1 | 5/2003 | Kuthi et al. |
| 6,881,668 B2 | 4/2005 | Lee et al. |
| 7,042,095 B2 | 5/2006 | Noguchi et al. |
| 7,741,228 B2 | 6/2010 | Ueki et al. |

(Continued)

FOREIGN PATENT DOCUMENTS

| | | |
|---|---|---|
| JP | 2005-136152 | 5/2005 |
| KR | 10-2003-0083174 A | 10/2003 |

*Primary Examiner* — Caleen Sullivan
(74) *Attorney, Agent, or Firm* — Myers Bigel Sibley

(57) ABSTRACT

Methods of forming a wiring structure are provided including forming an insulating interlayer on a substrate and forming a sacrificial layer on the insulating interlayer. The sacrificial layer is partially removed to define a plurality of openings. Wiring patterns are formed in the openings. The sacrificial layer is transformed into a modified sacrificial layer by a plasma treatment. The modified sacrificial layer is removed by a wet etching process. An insulation layer covering the wiring patterns is formed on the insulating interlayer. The insulation layer defines an air gap therein between neighboring wiring patterns.

20 Claims, 17 Drawing Sheets

(56) References Cited

U.S. PATENT DOCUMENTS

| | | |
|---|---|---|
| 7,763,538 B2 | 7/2010 | Turner et al. |
| 7,902,068 B2 | 3/2011 | Watanabe et al. |
| 8,148,235 B2 | 4/2012 | Naujok et al. |
| 8,389,376 B2 | 3/2013 | Demos et al. |
| 8,586,447 B2 | 11/2013 | Noguchi et al. |
| 2005/0136556 A1* | 6/2005 | Matsuura .......... H01L 27/11502 438/3 |
| 2007/0080382 A1* | 4/2007 | Kikuchi ............ H01L 21/28518 257/295 |
| 2008/0311742 A1* | 12/2008 | Watanabe ......... H01L 21/76816 438/675 |
| 2011/0221062 A1 | 9/2011 | Clevenger et al. |
| 2011/0260326 A1 | 10/2011 | Clevenger et al. |
| 2012/0032344 A1* | 2/2012 | Usami ............... H01L 21/76807 257/774 |
| 2013/0264201 A1 | 10/2013 | Edelberg |

* cited by examiner

METHODS OF FORMING WIRING STRUCTURES AND METHODS OF FABRICATING SEMICONDUCTOR DEVICES

CROSS-REFERENCE TO RELATED APPLICATION

This application claims priority under 35 USC §119 to Korean Patent Application No. 10-2014-0001297, filed on Jan. 6, 2014 in the Korean Intellectual Property Office (KIPO), the content of which is incorporated by reference herein in its entirety.

FIELD

The present inventive concept relates generally to semiconductor devices and, more particularly, to methods of fabricating semiconductor devices having wiring structures including an air gap and related devices.

BACKGROUND

As a degree of integration of a semiconductor device has increased, a distance or a pitch between wiring patterns in the semiconductor device has decreased. Accordingly, a parasitic capacitance between the neighboring wiring patterns may be significantly generated to cause a reduction of an operational speed of the semiconductor device. An air gap may be formed between the neighboring wiring patterns in order to suppress the generation of the parasitic capacitance.

SUMMARY

Some embodiments of the present inventive concept provide methods of forming a wiring structure including forming an insulating interlayer on a substrate. A sacrificial layer is formed on the insulating interlayer. The sacrificial layer is partially removed to define a plurality of openings. Wiring patterns are formed in the openings. The sacrificial layer is transformed into a modified sacrificial layer by a plasma treatment. The modified sacrificial layer is removed by a wet etching process. An insulation layer covering the wiring patterns is formed on the insulating interlayer. The insulation layer defines an air gap therein between neighboring wiring patterns.

In further embodiments, the sacrificial layer may be formed using silicon oxide that includes hydrocarbon groups.

In still further embodiments, the sacrificial layer may be formed using one of a tetraethyl orthosilicate (TEOS)-based silicon oxide and polysiloxane including alkyl substituents.

In some embodiments, the modified sacrificial layer may have a hydrogen content greater than a hydrogen content of the sacrificial layer.

In further embodiments, the modified sacrificial layer may have a hydrophilicity greater than a hydrophilicity of the sacrificial layer.

In still further embodiments, the plasma treatment may be performed using a reactive gas that includes at least one of ammonia ($NH_3$), nitrogen ($N_2$) and hydrogen ($H_2$).

In some embodiments, the plasma treatment may be performed by applying a single high frequency (HF) power.

In further embodiments, the single HF power may range from about 0.004 $W/mm^2$ to about 0.02 $W/mm^2$.

In still further embodiments, the plasma treatment may be performed at a pressure ranging from about 1 torr to about 5 torr.

In some embodiments, transforming the sacrificial layer into a modified sacrificial layer by the plasma treatment and removing the modified sacrificial layer by the wet etching process may be repeated for a plurality of cycles.

In further embodiments, a capping layer pattern may be formed on the wiring pattern.

In still further embodiments, in the formation of the capping layer pattern, a capping layer may be formed on the sacrificial layer and the wiring patterns. The capping layer may be partially removed to form the capping layer pattern. The capping layer pattern may have a width greater than a width of the wiring pattern.

In some embodiments, in the formation of the capping layer pattern, an upper portion of the wiring pattern may be partially removed to form a recess. A capping layer filling the recess may be formed on the sacrificial layer. An upper portion of the capping layer may be planarized.

In further embodiments, in the formation of the wiring patterns, a barrier conductive layer may be formed on the sacrificial layer, and sidewalls and bottoms of the openings. A conductive layer filling the openings may be formed on the barrier conductive layer. Upper portions of the conductive layer and the barrier conductive layer may be planarized to form a conductive pattern and a barrier conductive layer pattern.

Still further embodiments of the present inventive concept provide methods of manufacturing semiconductor devices are provided including forming a transistor on a substrate. An insulating interlayer covering the transistor is formed on the substrate. Contacts are formed through the insulating interlayer to be electrically connected to the transistor. A sacrificial layer is formed on the insulating interlayer. The sacrificial layer is partially removed to form a plurality of openings. Wiring patterns are formed in the openings. The sacrificial layer is transformed into a modified sacrificial layer by a plasma treatment. The modified sacrificial layer is removed by a wet etching process. An insulation layer covering the wiring patterns is formed on the insulating interlayer. The insulation layer includes an air gap therein between the neighboring wiring patterns.

In some embodiments, the plasma treatment may be performed using a single high frequency power that ranges from about 0.004 $W/mm^2$ to about 0.02 $W/mm^2$.

Further embodiments of the present inventive concept provide methods of forming a wiring structure including forming an insulating interlayer on a substrate; forming a sacrificial layer on the insulating interlayer having a plurality of openings therein the expose at least a portion of the insulating layer; forming wiring patterns in the openings; removing portions of the sacrificial layer between wiring patterns; and forming an insulation layer between spaces in the wiring patterns resulting from the removal of the sacrificial layer, the insulation layer having poor gap-filling characteristics such that the insulation layer defines an air gap between the wiring patterns.

In still further embodiments, the method may further include performing a plasma treatment on the sacrificial layer to provide a modified sacrificial layer, wherein removing comprises removing the modified sacrificial layer by wet etching the modified sacrificial layer.

In some embodiments, performing a plasma treatment may include performing a plasma treatment using a single high frequency (HF) power. The single HF power range may be from about 0.004 $W/mm^2$ to about 0.02 $W/mm^2$.

BRIEF DESCRIPTION OF THE DRAWINGS

Some embodiments of the present inventive concept will be more clearly understood from the following detailed description taken in conjunction with the accompanying drawings.

FIGS. 1 to 8 are cross-sections illustrating processing steps in the fabrication of a wiring structure in accordance with some embodiments of the present inventive concept.

FIGS. 9 to 14 are cross-sections illustrating processing steps in the fabrication of a wiring structure in accordance with some embodiments of the present inventive concept.

FIGS. 15 to 17 are cross-sections illustrating processing steps in the fabrication of a wiring structure in accordance with some embodiments of the present inventive concept.

FIGS. 18 to 23 are cross-sections illustrating processing steps in the fabrication of a wiring structure in accordance with some embodiments of the present inventive concept.

FIGS. 24 to 32 are cross-sections illustrating processing steps in the fabrication of a semiconductor device in accordance with some embodiments of the present inventive concept.

DETAILED DESCRIPTION OF EMBODIMENTS

Figure 1:
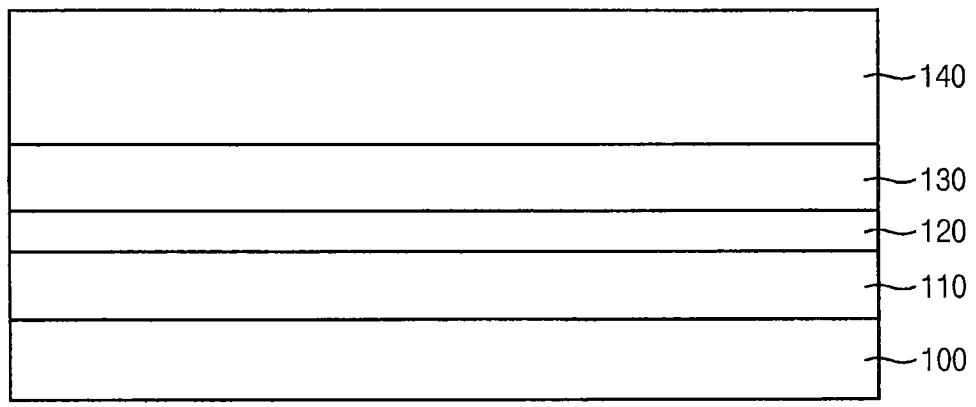
FIGS. 1 to 32 represent non-limiting, some embodiments as described herein.

Various some embodiments will be described more fully hereinafter with reference to the accompanying drawings, in which some embodiments are shown. The present inventive concept may, however, be embodied in many different forms and should not be construed as limited to the some embodiments set forth herein. Rather, these some embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular some embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some embodiments are described herein with reference to cross-sectional illustrations that are schematic illustrations of idealized some embodiments (and intermediate structures). As such, variations from the shapes of the illustrations as a result, for example, of manufacturing techniques and/or tolerances, are to be expected. Thus, some embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 8 are cross-sections illustrating processing steps in the fabrication of a wiring structure in accordance with some embodiments of the present inventive concept.

As illustrated in FIG. 1, a first insulating interlayer 110, a passivation layer 120, a second insulating interlayer 130 and a sacrificial layer 140 are formed sequentially on a substrate 100.

The substrate 100 may include a semiconductor substrate, for example, a silicon substrate, a germanium substrate, a silicon-germanium substrate, a silicon-on-insulator (SOI) substrate, a germanium-on-insulator (GOI) substrate, and the like. A group 3-group 5 (III-V) semiconductor substrate including, for example, a GaP substrate, a GaAs substrate or a GaSb substrate may be also used as the substrate 100 in some embodiments.

The first insulating interlayer 110 may include a silicon oxide-based material having a low dielectric constant (also referred to as a low-k material). Examples of the silicon oxide-based material may include plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG) or the like. These materials may be used alone or may be combined with others of these materials without departing from the scope of the present inventive concept.

In some embodiments, electronic devices such as a switching device or transistor, and a lower wiring may be formed on the substrate 100, and the first insulating interlayer 110 may cover the electronic device and the lower wiring.

The passivation layer 120 may be formed using, for example, silicon nitride or silicon oxynitride. The passivation layer 120 may protect the lower wiring or the electronic device from subsequent processes, for example, a subsequent etching process. For example, the passivation layer 120 may serve as an etch-stop layer.

The second insulating interlayer 130 may be formed using a material substantially the same as or similar to that of the first insulating interlayer 110. For example, the second insulating interlayer 130 may be formed using the above mentioned low-k material. In some embodiments, a contact or a plug may be formed through the second insulating interlayer 130 and the passivation layer 120 to be electrically connected to the electronic device and/or the lower wiring.

The sacrificial layer 140 may be formed using a material having a low dielectric constant and capable of easily being modified by a plasma treatment. For example, the sacrificial layer 140 may be formed using a silicon oxide-based material including hydrocarbon groups such as alkyl groups. In some embodiments, the sacrificial layer 140 may be formed using a TEOS-based silicon oxide including, for example, TEOS, BTEOS, PTEOS or BPTEOS, or polysiloxane including alkyl substituents.

In some embodiments, the sacrificial layer 140 and the second insulating interlayer 130 may include substantially the same material. In these embodiments, the sacrificial layer 140 and the second insulating interlayer 130 may be integral or merged with each other. In some embodiments, the sacrificial layer 140, the second insulating interlayer 130 and the first insulating interlayer 110 may include substantially the same material.

For example, the first insulating interlayer 110, the passivation layer 120, the second insulating interlayer 130 and the sacrificial layer 140 may be formed by, for example, a chemical vapor deposition (CVD) process, a low pressure chemical vapor deposition (LPCVD) process, a plasma enhanced chemical vapor deposition (PECVD) process, a high density plasma-chemical vapor deposition (HDP-CVD) process or a spin coating process.

Figure 2:
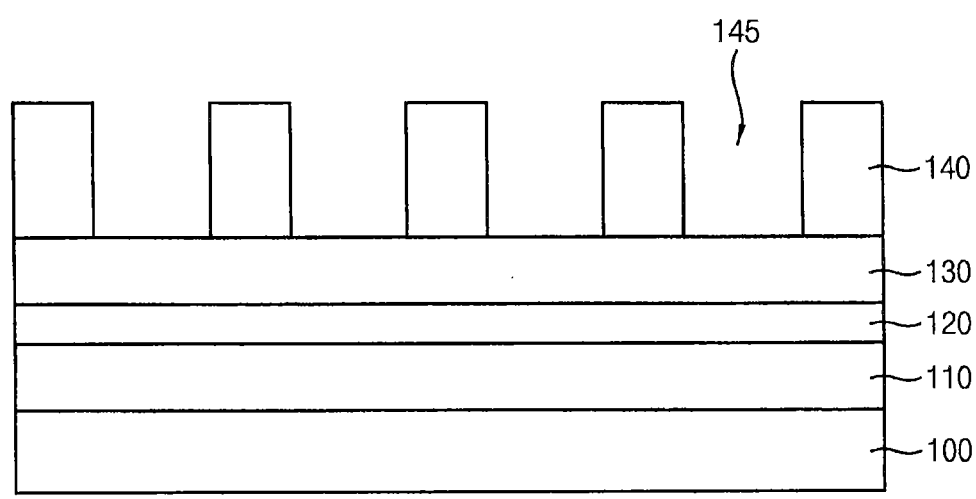

As illustrated in FIG. 2, the sacrificial layer 140 may be partially removed to form a first opening 145. A top surface of the second insulating interlayer 130 may be exposed by the first opening 145. In some embodiments, the sacrificial layer 140 may be partially removed by a photolithography process. For example, a photoresist layer may be formed on the sacrificial layer 140, and then the photoresist layer may be patterned by exposure and developing processes to form a photoresist pattern. The sacrificial layer 140 may be partially removed using the photoresist pattern as an etching mask to form the first opening. In some embodiments, a plurality of the first openings 145 may be formed. The photoresist pattern may be removed by an ashing process and/or a strip process. In some embodiments, an anti-reflective layer may be formed before forming the photoresist layer.

Figure 3:
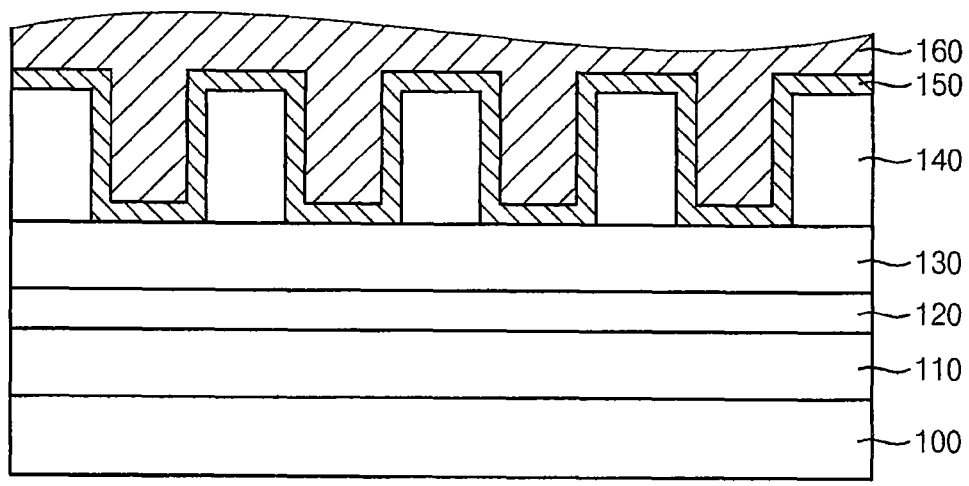

Referring now to FIG. 3, a barrier conductive layer 150 and a conductive layer 160 filling the first opening 145 may be formed. In some embodiments, the barrier conductive layer 150 may be formed conformably on a top surface of the sacrificial layer 140 and on a sidewall and a bottom of the first opening 145. The barrier conductive layer 150 may be formed using a metal nitride, such as titanium nitride (TiNx), tantalum nitride (TaNx) or tungsten nitride (WNx). The barrier conductive layer 150 may reduce the likelihood that a material contained in the conductive layer 160 will be diffused to the sacrificial layer 140 and/or the second insulating interlayer 130. Furthermore, the barrier conductive layer 150 may provide an adhesion for forming the conductive layer 160.

The conductive layer 160 may be formed on the barrier conductive layer 150 and may sufficiently fill the first opening 145. The conductive layer 160 may include, for example, a metal such as copper (Cu), aluminum (Al), titanium (Ti) or tungsten (W).

The barrier conductive layer 150 and the conductive layer 160 may be formed by, for example, a physical vapor deposition (PVD) process, a sputtering process or an atomic layer deposition (ALD) process.

Figure 4:
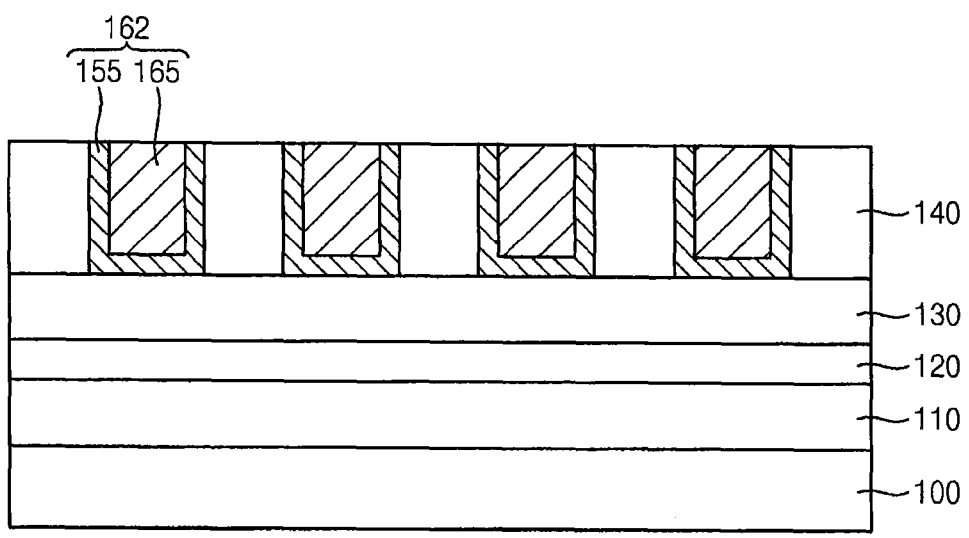

Referring now to FIG. 4, upper portions of the conductive layer 160 and the barrier conductive layer 150 may be removed to form a barrier conductive layer pattern 155 and a conductive pattern 165 filling the first opening 145. Accordingly, a wiring pattern 162 including the barrier conductive layer pattern 155 and the conductive pattern 165 may be formed in the first opening 145.

In some embodiments, the conductive layer 160 and the barrier conductive layer 150 may be planarized by, for example, a chemical mechanical polish (CMP) process to form the barrier conductive layer pattern 155 and the conductive layer pattern 165.

Figure 5:
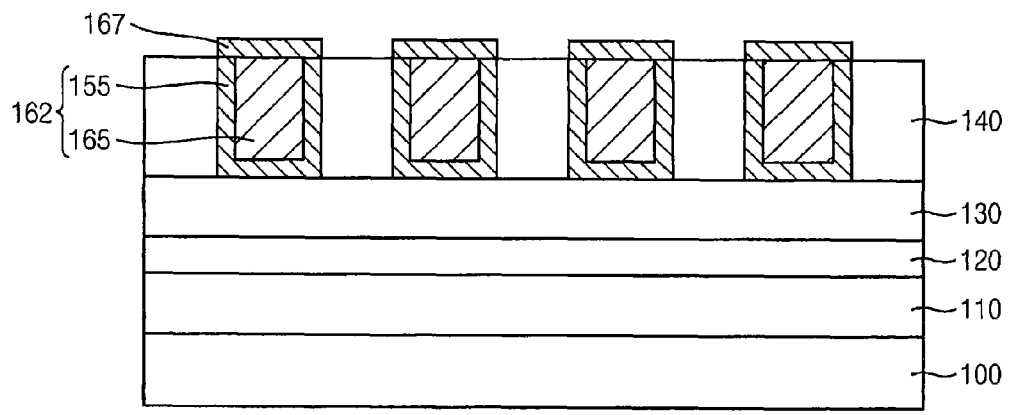

Referring to now to FIG. 5, a capping layer pattern 167 may be formed on the wiring pattern 162. In some embodiments, a capping layer may be formed on the sacrificial layer 140, the barrier conductive layer pattern 155 and the conductive pattern 165, and then the capping layer may be partially etched to form the capping layer pattern 167.

The capping layer may be formed using a metal that may have physical and chemical stability greater than that of the conductive pattern 165. For example, the capping layer may include a metal, such as aluminum, cobalt (Co) or molybdenum (Mo), or a nitride of the metal. The capping layer may be formed by, for example, a PVD process, a sputtering process or an ALD process. The capping layer may be etched by a wet etching process using an etchant solution that may contain hydrogen peroxide ($H_2O_2$), phosphoric acid and/or sulfuric acid.

Figure 6:
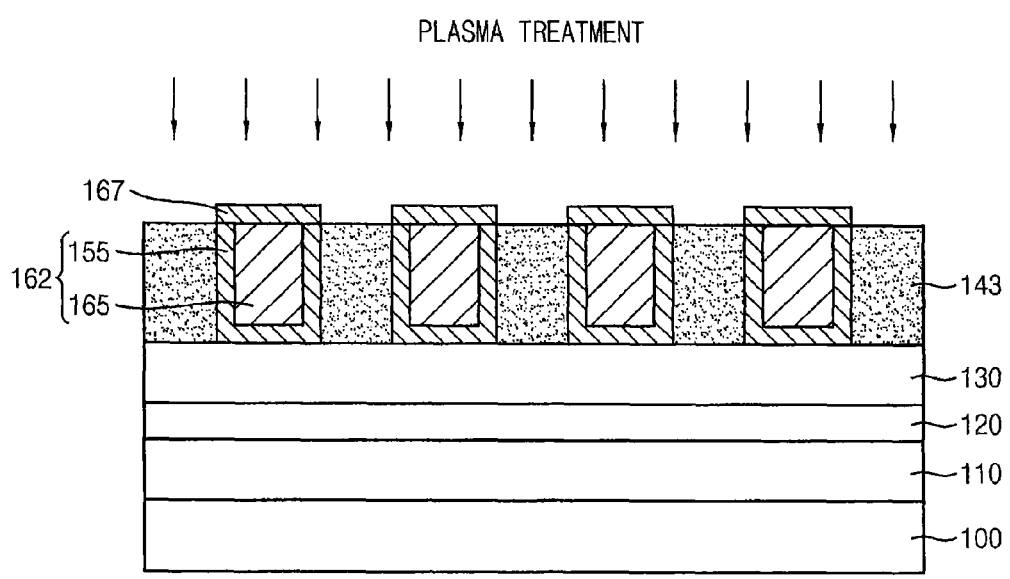

Referring now to FIG. 6, a plasma treatment may be performed to transform the sacrificial layer 140 into a modified sacrificial layer 143. In some embodiments, the plasma treatment may include a reductive plasma treatment. For example, a reactive gas for the plasma treatment may include ammonia ($NH_3$), nitrogen ($N_2$) or hydrogen ($H_2$). These may be used alone or in combination. In these embodiments, the reactive gas may be introduced into a process chamber and a radiofrequency (RF) power may be applied into the process chamber, so that the reactive gas may be changed into a plasma.

A chemical structure of the sacrificial layer 140 may be changed by the plasma treatment to form the modified sacrificial layer 143. For example, a chemical structure of silicon oxide included in the sacrificial layer 140 may be changed by plasma induced damage (PID). In some embodiments, if the sacrificial layer 140 includes silicon oxide containing the alkyl groups, the alkyl groups may be reduced and removed.

By the removal of the alkyl groups, the modified sacrificial layer 143 may have a hydrophilicity greater than that of the sacrificial layer 140. In some embodiments, the modified sacrificial layer 143 may have a hydrogen content greater than that of the sacrificial layer 140. In these embodiments, a net structure of silicon-oxygen (Si—O) bondings in the sacrificial layer 140 may be partially damaged by an increase of the hydrogen content.

The wiring pattern 162 may be covered by the capping layer pattern 167. Thus, the wiring pattern 162 may be protected from the PID. In some embodiments, the plasma treatment may be performed using a single power applied to the process chamber. For example, the plasma treatment may be performed using a single high-frequency (HF) power.

In some embodiments, the plasma treatment may be performed using a dual power. In these embodiments, the reactive gas may be changed into the plasma by a HF power, and an intensity of the plasma or a collision speed of a plasma ion may be enhanced by a low-frequency (LF) power. When the plasma enhanced by the LF power collides with the sacrificial layer 140, the second insulating interlayer 130 under the sacrificial layer 140 may be also modified. Thus, the second insulating interlayer 130 may be partially removed or damaged by a subsequent etching process. Furthermore, the enhanced plasma may directly remove the sacrificial layer 140 and the second insulating interlayer 130 to result in a leaning or a collapse of the wiring pattern 162.

In some embodiments, the sacrificial layer 140 may be modified by the enhanced plasma to have a strengthened structure. In these embodiments, the modified sacrificial layer 143 may not be fully removed by the subsequent etching process.

As discussed above, in the plasma treatment using the dual power, a distribution of an amount of the removed sacrificial layer 140 may become large. Thus, air gaps 180 (see FIG. 8) may not be formed as a uniform shape throughout regions at which the wiring patterns 162 are formed.

However, according to some embodiments, the modified sacrificial layer 143 may be formed by the plasma treatment using the single HF power, so that the likelihood of a non-uniform removal of the sacrificial layer 140 may be reduced.

In some embodiments, the single HF power may range from about 0.004 W/mm² to about 0.02 W/mm². If the single HF power is less than about 0.004 W/mm², the sufficient plasma may not be generated, and thus the sacrificial layer 140 may not be fully or uniformly changed into the modified sacrificial layer 143. If the single HF power is greater than about 0.02 W/mm², the plasma ion may be excessively accelerated so that the sacrificial layer 140 may be directly removed by the plasma treatment and the second insulating interlayer 130 may be damaged.

In some embodiments, the plasma treatment may be performed at a pressure ranging from about 1.0 torr to about 5.0 torr. If the pressure is less than about 1.0 torr, a mean free path of the plasma ion may be increased so that the plasma ion may be excessively accelerated. Thus, the sacrificial layer 140 may be directly removed by the plasma treatment and the second insulating interlayer 130 may be damaged. If the pressure is greater than about 5.0 torr, the sufficient collision speed of the plasma ion may not be achieved. Thus, the sacrificial layer 140 may not be fully or uniformly changed into the modified sacrificial layer 143.

Figure 7:
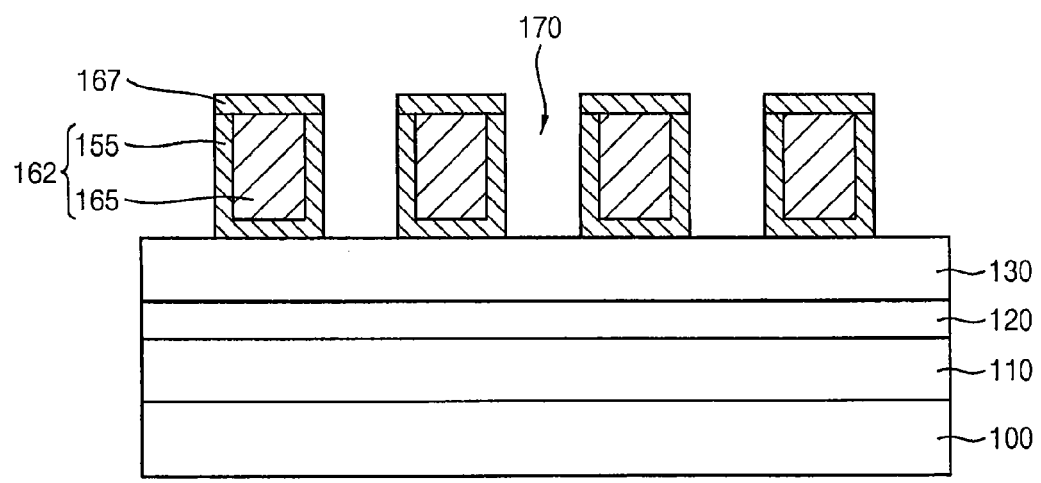

Referring now to FIG. 7, the modified sacrificial layer 143 may be removed to form a second opening 170. A plurality of the second openings 170 may be defined between a plurality of the wiring patterns 162.

In some embodiments, the modified sacrificial layer 143 may be removed by a wet etching process using an etchant solution that may have an etching selectivity for silicon oxide. Thus, the likelihood of an etching damage of the wiring pattern 162 which may be caused by a dry etching process may be reduces. The etchant solution may include a hydrofluoric acid (HF) or a buffer oxide etchant (BOE).

In some embodiments, the modified sacrificial layer 143 and the second insulating interlayer 130 may have different chemical structures. Thus, the modified sacrificial layer 143 may be selectively removed by, for example, controlling an etching rate. For example, the hydrophilicity of the modified sacrificial layer 143 may be strengthened by the plasma treatment. Thus, the modified sacrificial layer 143 may have a relatively strong affinity with the etchant solution that may contain the hydrofluoric acid. Therefore, the etching rate or an etching selectivity of the wet etching process may be improved by the transformation of the sacrificial layer 140 into the modified sacrificial layer 143.

By removing the modified sacrificial layer 143, the second opening 170 may be defined between the neighboring wiring patterns 162. In some embodiments, a plurality of the second openings 170 may be defined between a plurality of the wiring patterns 162. The top surface of the second insulating interlayer 130 may be exposed by the second opening 170.

Figure 8:
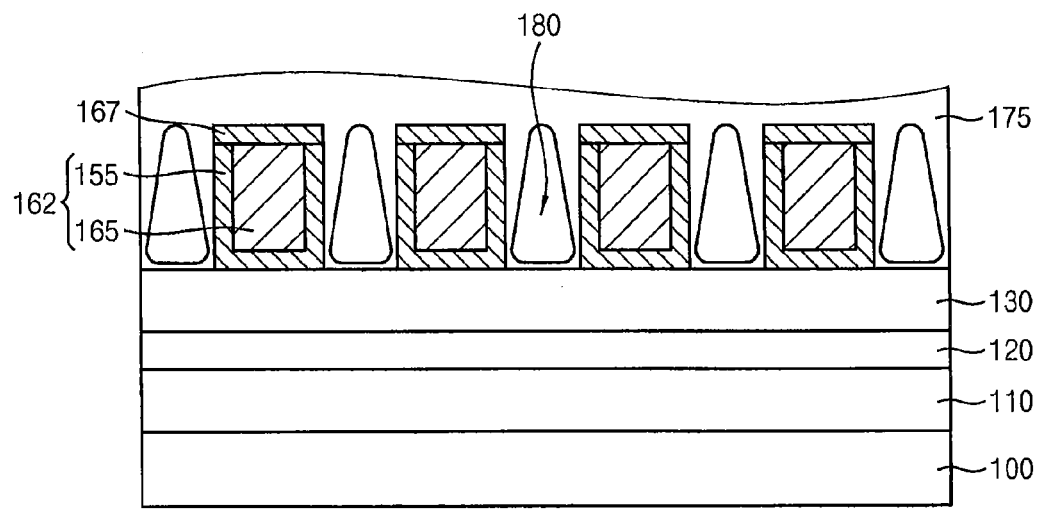

Referring to FIG. 8, an insulation layer 175 covering the wiring pattern 162 and the capping layer pattern 167 may be formed on the second insulating interlayer 130. In some embodiments, the insulation layer 175 may include an air gap 180 therein between the neighboring wiring patterns 162.

In some embodiments, the insulation layer 175 may be formed using a material or a process condition that may have poor conformal and/or gap-filling characteristics. For example, the insulation layer 175 may be formed using silicon oxide, such as TEOS or a CVD oxide by a CVD process or a spin coating process.

Thus, the insulation layer 175 may be overhung by the capping layer pattern 167 and/or the wiring pattern 162 at an entrance of the second opening 170, so that the insulation layer 175 may not completely fill the second opening 170. Therefore, the air gap 180 may be formed between the neighboring wiring patterns 162.

According to some embodiments, the sacrificial layer 140 may be removed uniformly by a combination of the plasma treatment and the wet etching process. Accordingly, the air gaps 180 having a uniform shape and a uniform height may be obtained throughout the regions at which the wiring patterns 162 are formed. In some embodiments, a planarization process, for example, a CMP process, may be further performed on an upper portion of the insulation layer 175.

FIGS. 9 to 14 are cross-sections illustrating processing steps in the fabrication of a wiring structure in accordance with some embodiments. Detailed descriptions on processes and/or materials substantially the same or similar to those illustrated with reference to FIGS. 1 to 8 will not be discussed further herein in the interest of brevity. Like reference numerals refer to like elements throughout.

Figure 9:
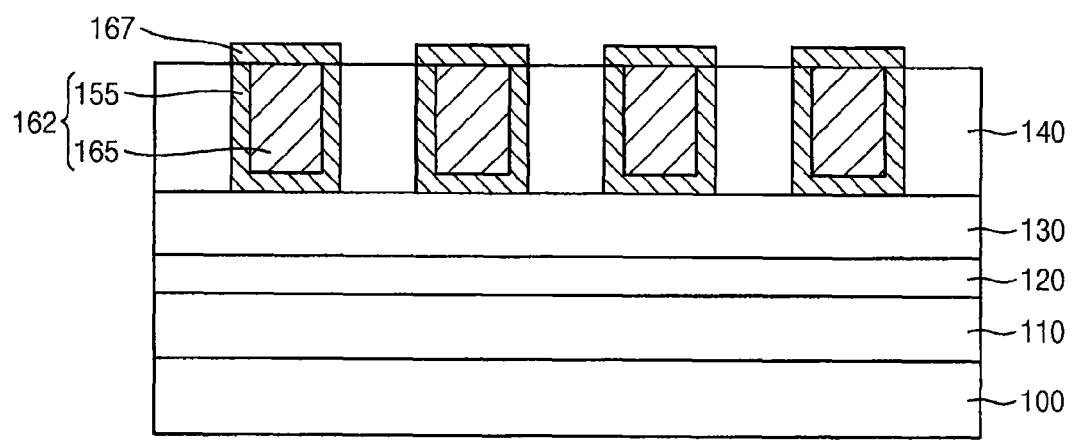

Referring first to FIG. 9, processes substantially the same as or similar to those illustrated with reference to FIGS. 1 to 5 may be performed. Accordingly, a first insulating interlayer 110, a passivation layer 120, a second insulating interlayer 130 and a sacrificial layer 140 may be formed on a substrate 100. A wiring pattern 162 including the barrier conductive layer pattern 155 and a conductive pattern 165 may be formed in the sacrificial layer 140. A capping layer pattern 167 may be formed on the wiring pattern 162.

Figure 10:
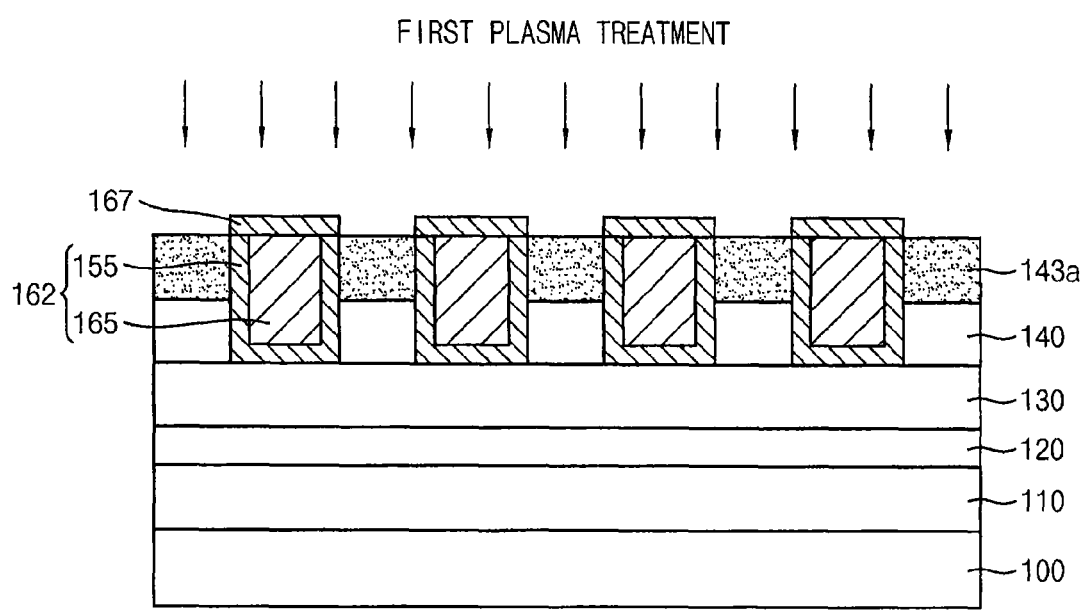

Referring now to FIG. 10, a first plasma treatment may be performed to transform an upper portion of the sacrificial layer 140 into a first modified sacrificial layer 143a. The first plasma treatment may be performed in a condition substantially the same as or similar to that of the plasma treatment illustrated with reference to FIG. 6. In some embodiments, the first plasma treatment may be performed using a reactive gas having a reductive property and a single HF power ranging from about 0.004 W/mm$^2$ to about 0.02 W/mm$^2$, and at a pressure ranging from about 1.0 torr to about 5.0 torr.

A process time of the first plasma treatment may be smaller than that of the plasma treatment illustrated with reference to FIG. 6. In some embodiments, a flow rate of the reactive gas for the first plasma treatment may be smaller than that of the plasma treatment illustrated with reference to FIG. 6.

Thus, a modification rate or a modification amount of the sacrificial layer 140 may be reduced, so that the upper portion of the sacrificial layer may be transformed into the first modified sacrificial layer 143a.

Figure 11:
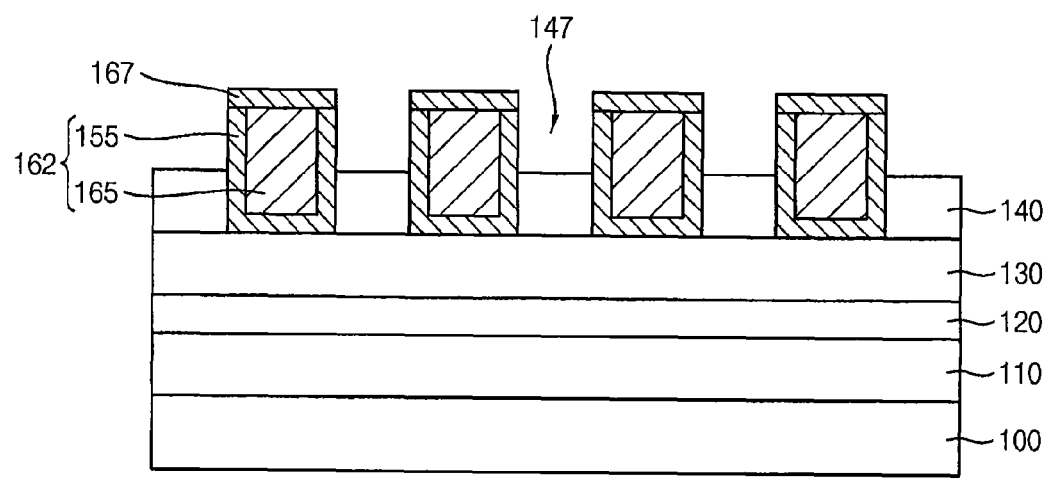

Referring now to FIG. 11, the first modified sacrificial layer 143a may be removed such that a trench 147 exposing a remaining portion of the sacrificial layer 140 may be formed. In some embodiments, the first modified sacrificial layer 143a may be removed by a wet etching process using an etchant solution that may include a hydrofluoric acid or a BOE solution as discussed with respect to FIG. 7. The first modified sacrificial layer 143a may have an affinity for the etchant solution stronger than that of the sacrificial layer 140. Thus, the first modified sacrificial layer 143a may be selectively removed while the remaining portion of the sacrificial layer 140 may be remained.

Figure 12:
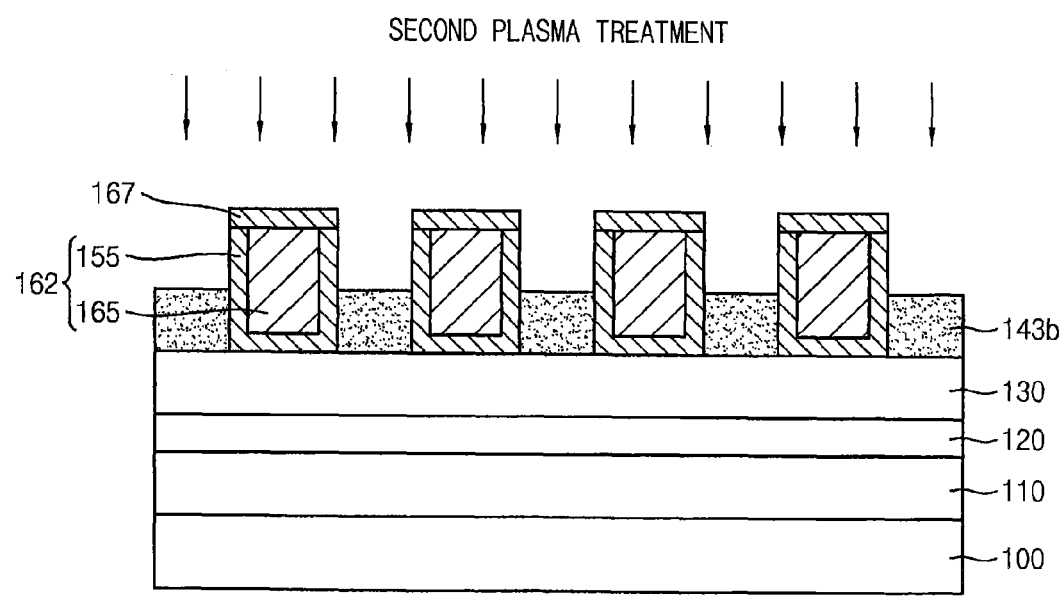

Referring to FIG. 12, a second plasma treatment may be performed to transform the remaining sacrificial layer 140 exposed by the trench 147 into a second modified sacrificial layer 143b. In some embodiments, the second plasma treatment may be performed in a condition substantially the same as or similar to that of the first plasma treatment. For example, the second plasma treatment may be performed using a reactive gas having a reductive property and a single HF power ranging from about 0.004 W/mm$^2$ to about 0.02 W/mm$^2$, and at a pressure ranging from about 1.0 torr to about 5.0 torr. A process time of the second plasma treatment may be smaller than that of the plasma treatment illustrated with reference to FIG. 6. In some embodiments, a flow rate of the reactive gas for the second plasma treatment may be smaller than that of the plasma treatment illustrated with reference to FIG. 6.

Figure 13:
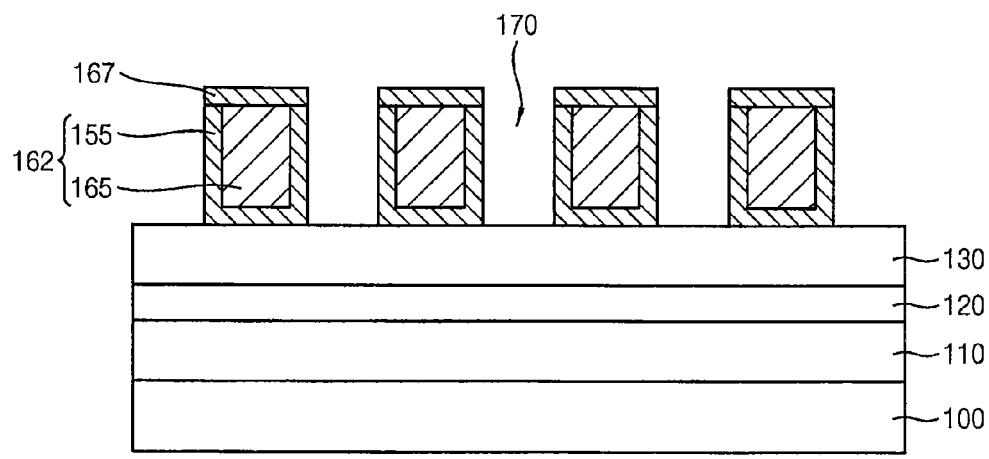

Referring to FIG. 13, a process substantially the same as or similar to that illustrated with reference to FIG. 11 may be performed to remove the second modified sacrificial layer 143b. Accordingly, a second opening 170 may be formed between the neighboring wiring patterns 162. A top surface of the second insulating interlayer 130 may be exposed by the second opening 170.

Figure 14:
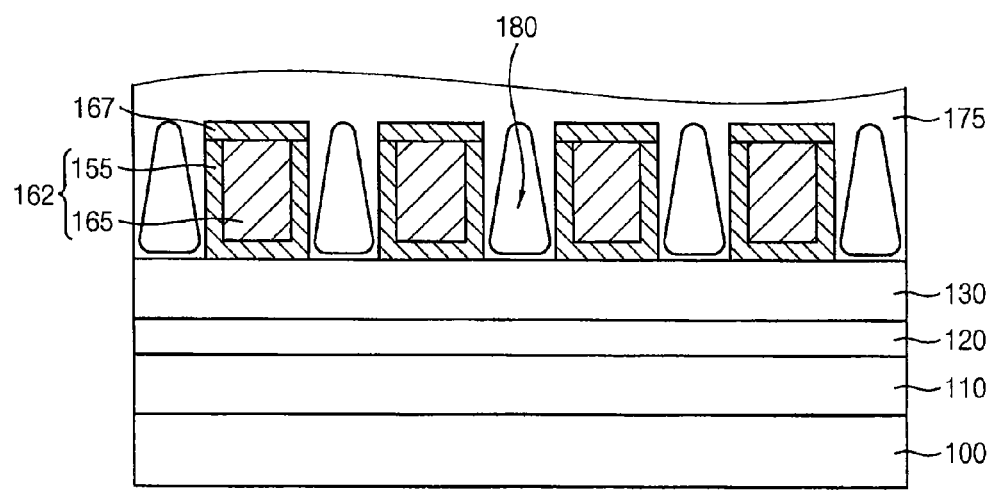

Referring to FIG. 14, a process substantially the same as or similar to that illustrated with reference to FIG. 8 may be performed. Accordingly, an insulation layer 175 covering the wiring pattern 162 and the capping layer pattern 167 may be formed on the second insulating interlayer 130. In some embodiments, an air gap 180 may be formed in the insulation layer 175 and between the neighboring wiring patterns 162.

According to some embodiments, a removal cycle including a formation of the modified sacrificial layer by the plasma treatment and a removal of the modified sacrificial layer by the wet etching process may be repeated. Accordingly, an etching rate or an etching amount of the sacrificial layer 140 may be controlled more precisely. Thus, the sacrificial layer 140 may be removed more uniformly, and thus a uniformity of the air gaps 180 may be also improved compared to the case that the sacrificial layer 140 is removed by one removal cycle.

FIGS. 9 and 14 illustrate that the sacrificial layer 140 is removed by two removal cycles. However, embodiments of the present inventive concept are not limited to the number of the removal cycles discussed herein. For example, the number of the removal cycles may be determined in consideration of a process cost, a thickness of the sacrificial layer 140, and the like.

Figure 15:
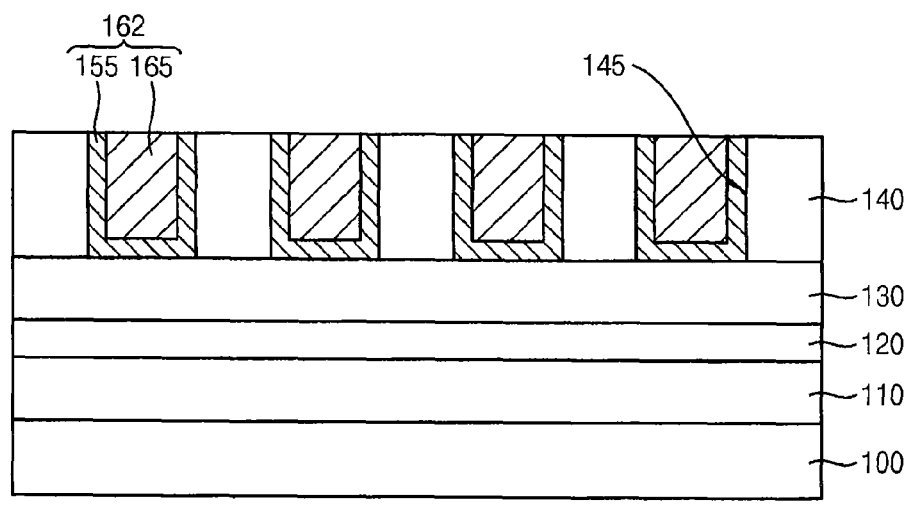
Figure 16:
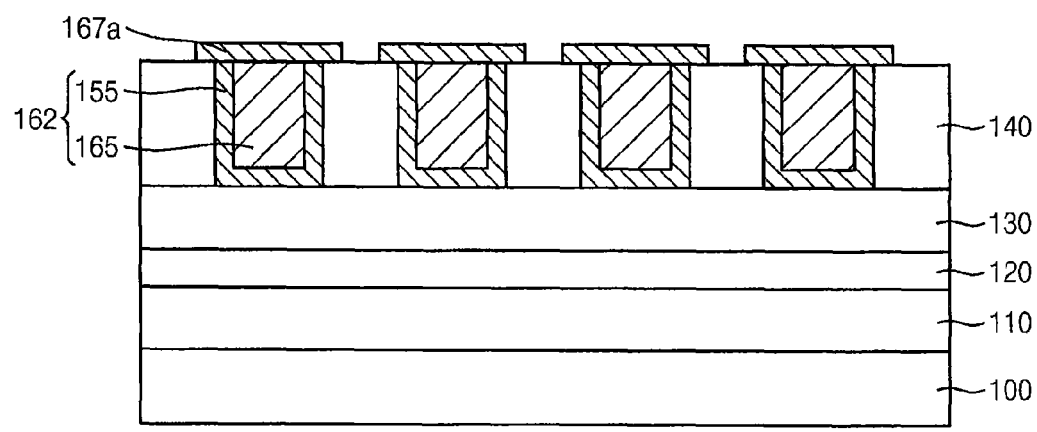
Figure 17:
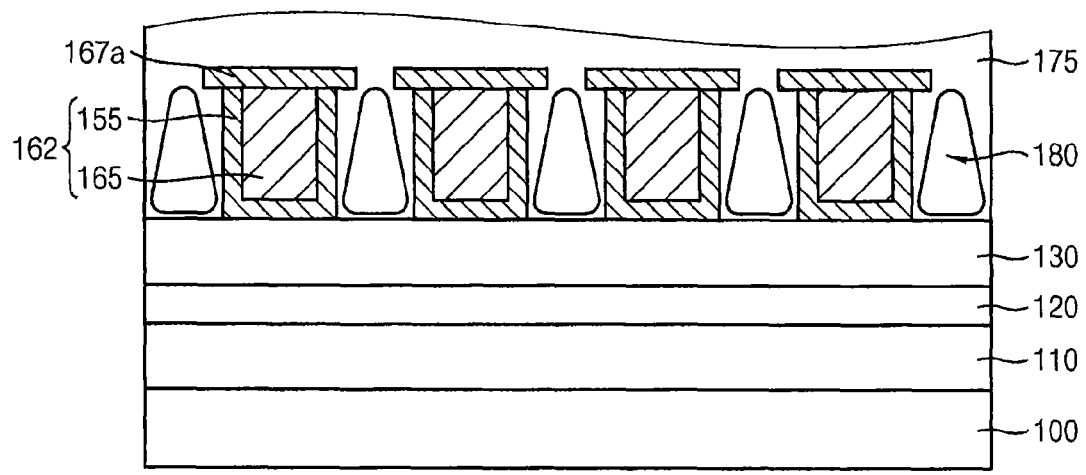

FIGS. 15 to 17 are cross-sections illustrating processing steps in the fabrication of a wiring structure in accordance with some embodiments. Detailed descriptions on processes and/or materials substantially the same or similar to those illustrated with reference to FIGS. 1 to 8 will not be discussed further herein in the interest of brevity. Like reference numerals refer to like elements throughout.

Referring to FIG. 15, processes substantially the same as or similar to those illustrated with reference to FIGS. 1 to 4 may be performed. Accordingly, a first insulating interlayer 110, a passivation layer 120, a second insulating interlayer 130 and a sacrificial layer 140 may be sequentially formed on a substrate 100. The sacrificial layer 140 may be partially removed to form a first opening 145. A wiring pattern 162 including a barrier conductive layer pattern 155 and a conductive pattern 165 may be formed in the first opening 145.

Referring to FIG. 16, a process substantially the same as or similar to that illustrated with reference to FIG. 5 may be performed to form a capping layer pattern 167a covering the wiring pattern 162.

In some embodiments, the capping layer pattern 167a may have a width greater than that of the wiring pattern 162. In these embodiments, the capping layer pattern 167a may completely cover an upper portion of the wiring pattern 162 and may also cover a portion of the sacrificial layer 140.

Referring to FIG. 17, processes substantially the same as or similar to those illustrated with reference to FIGS. 6 to 8 may be performed. Accordingly, the sacrificial layer 140 may be transformed into a modified sacrificial layer by a plasma treatment, and then the modified sacrificial layer may be removed by a wet etching process to form a second opening between the neighboring wiring patterns 162. An insulation layer 175 covering the wiring pattern 162 and the capping layer pattern 167a may be formed on the second insulating interlayer 130 using an insulation material that may have poor gap-filling characteristics. Thus, an air gap 180 may be formed in the insulation layer 175 and between the neighboring wiring patterns 162.

According to some embodiments, the capping layer pattern 167a may have the width greater than that of the wiring pattern 162 and may protrude laterally from the wiring pattern 162. Thus, an entrance of the second opening may become narrower by the capping layer pattern 167a, so that the insulation layer 175 may be easily overhung by the capping layer pattern 167a. Therefore, the gap-filling characteristics of the insulation layer 175 may be deteriorated, and the air gaps 180 may be easily formed to have a uniform shape between the neighboring wiring patterns 162.

In some embodiments, the sacrificial layer 140 may be removed by repeating a plurality of removal cycles as illustrated with reference to FIGS. 10 to 13.

FIGS. 18 to 23 are cross-sections illustrating processing steps in the fabrication of a wiring structure in accordance with some embodiments. Detailed descriptions on processes and/or materials substantially the same or similar to those illustrated with reference to FIGS. 1 to 8 will not be discussed further herein in the interest of brevity. Like reference numerals refer to like elements throughout.

Figure 18:
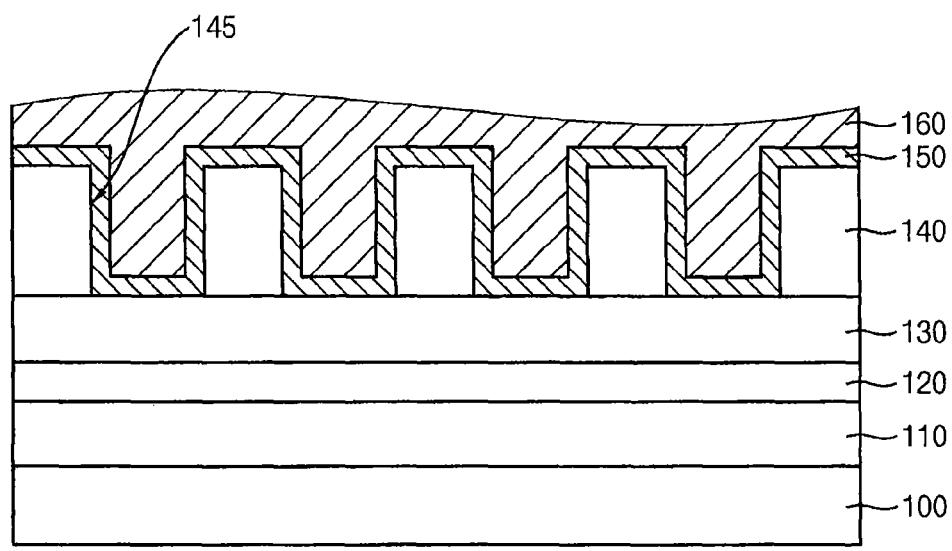

Referring to FIG. 18, processes substantially the same as or similar to those illustrated with reference to FIGS. 1 to 3 may be performed. Accordingly, a first insulating interlayer 110, a passivation layer 120, a second insulating interlayer 130 and a sacrificial layer 140 may be sequentially formed on a substrate 100. The sacrificial layer 140 may be partially removed to form a first opening 145. A barrier conductive layer 150 and a conductive layer 160 filling the first opening 145 may be formed on the sacrificial layer 140.

Figure 19:
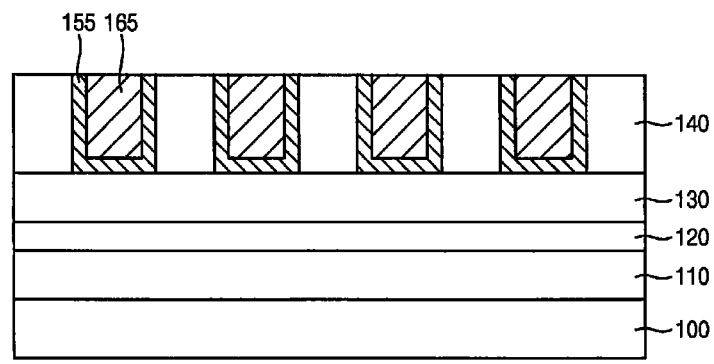

Referring to FIG. 19, a process substantially the same as or similar to those illustrated with reference to FIG. 4 may be performed. Accordingly, upper portions of the conductive layer 160 and the barrier conductive layer 150 may be planarized by, for example, a CMP process until a top surface of the sacrificial layer 140 is exposed to form a wiring pattern 162 including a barrier conductive layer pattern 155 and a conductive pattern 165.

Figure 20:
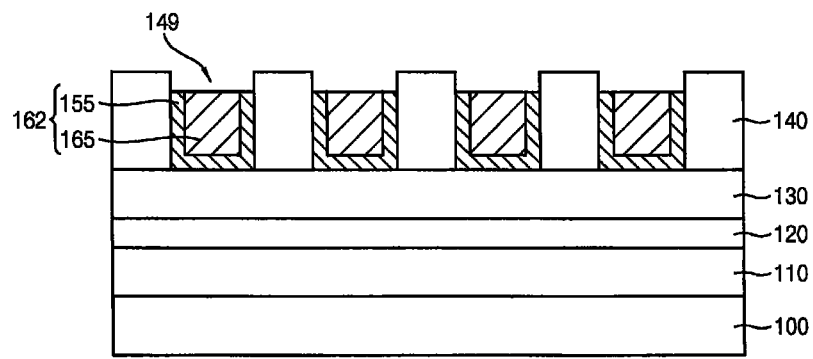

Referring to FIG. 20, an upper portion of the wiring pattern 162 may be removed to form a recess 149. In some embodiments, the conductive pattern 165 and the barrier conductive layer pattern 155 may be partially removed by an etch-back process to form the recess 149. The recess 149 may be defined by sidewalls of the sacrificial layer 140 and a top surface of the wiring pattern 162.

Figure 21:
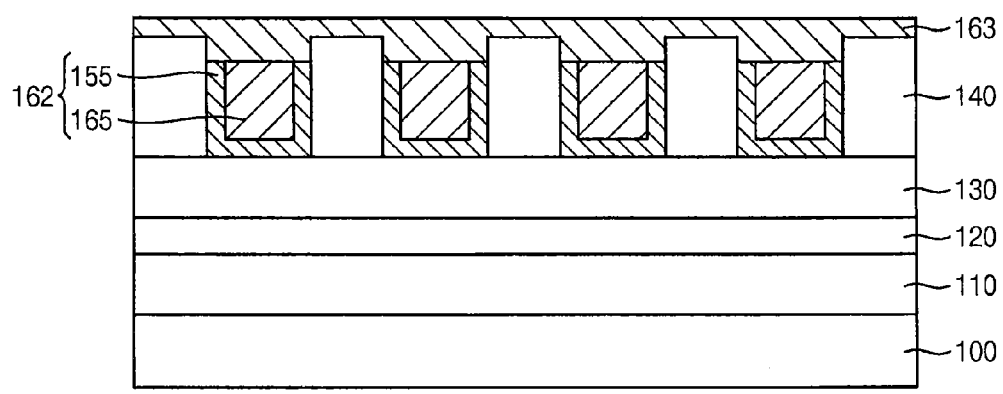

Referring to FIG. 21, a capping layer 163 sufficiently filling the recess 149 may be formed on the sacrificial layer 140. In some embodiments, the capping layer 163 may be formed using a metal of which a chemical stability is greater than that included in the conductive pattern 165. For example, the capping layer 163 may be formed using aluminum, cobalt or molybdenum, or a nitride of the metal.

Figure 22:
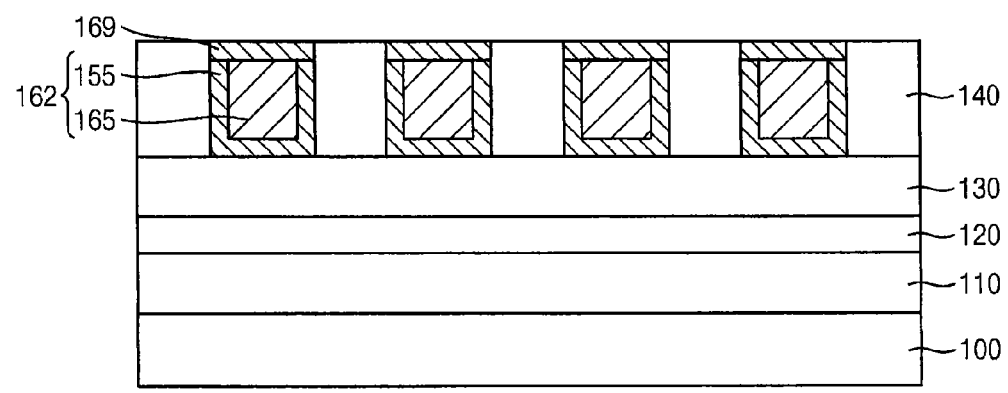

Referring to FIG. 22, an upper portion of the capping layer 163 may be planarized by a CMP process until a top surface of the sacrificial layer 140 is exposed. Accordingly, a capping layer pattern 169 filling the recess 149 may be formed on the conductive pattern 165 and the barrier conductive layer pattern 155.

Figure 23:
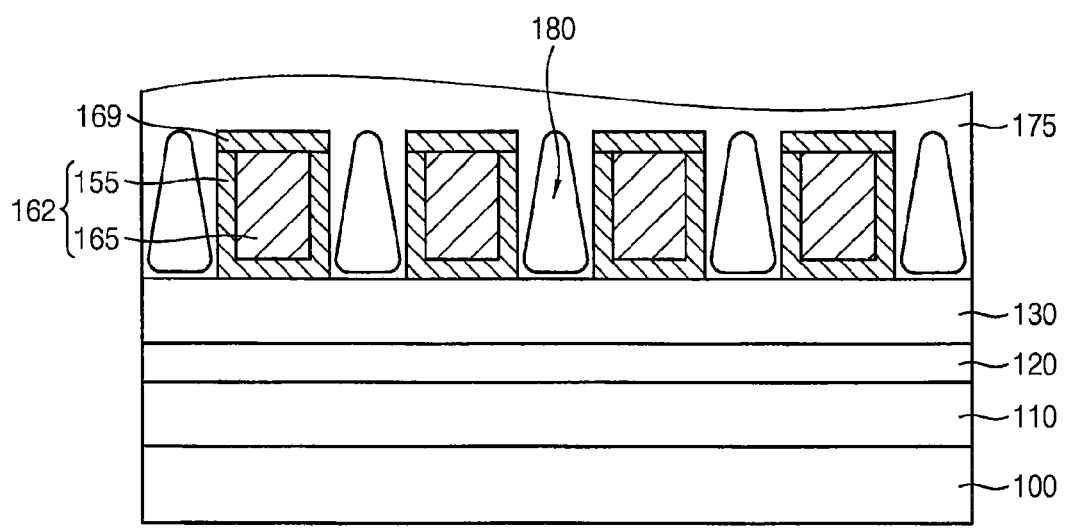

Referring to FIG. 23, processes substantially the same as or similar to those illustrated with reference to FIGS. 6 to 8 may be performed. Accordingly, the sacrificial layer 140 may be transformed into a modified sacrificial layer by a plasma treatment, and then the modified sacrificial layer may be removed by a wet etching process to form a second opening between the neighboring wiring patterns 169. An insulation layer 175 covering the wiring pattern 162 and the capping layer pattern 169 may be formed on the second insulating interlayer 130 using an insulation material that may have poor gap-filling characteristics. Thus, an air gap 180 may be formed in the insulation layer 175 and between the neighboring wiring patterns 162.

According to some embodiments, the capping layer pattern 169 may be formed in the recess 149, and thus the capping layer pattern 169 may be self-aligned on the wiring pattern 162. Therefore, the likelihood of a misalignment of the capping layer pattern 169 may be reduced, and the wiring pattern 162 may be protected from damages by the subsequent plasma treatment and etching processes In some embodiments, the sacrificial layer 140 may be removed by repeating a plurality of removal cycles as illustrated with reference to FIGS. 10 to 13.

FIGS. 24 to 32 are cross-sections illustrating processing steps in the fabrication of a semiconductor device in accordance with some embodiments. Detailed descriptions on processes and/or materials substantially the same or similar to those illustrated with reference to FIGS. 1 to 8, FIGS. 9 to 14, FIGS. 15 to 17, or FIGS. 18 to 23 are will not be discussed further herein in the interest of brevity. Like reference numerals refer to like elements throughout.

Figure 24:
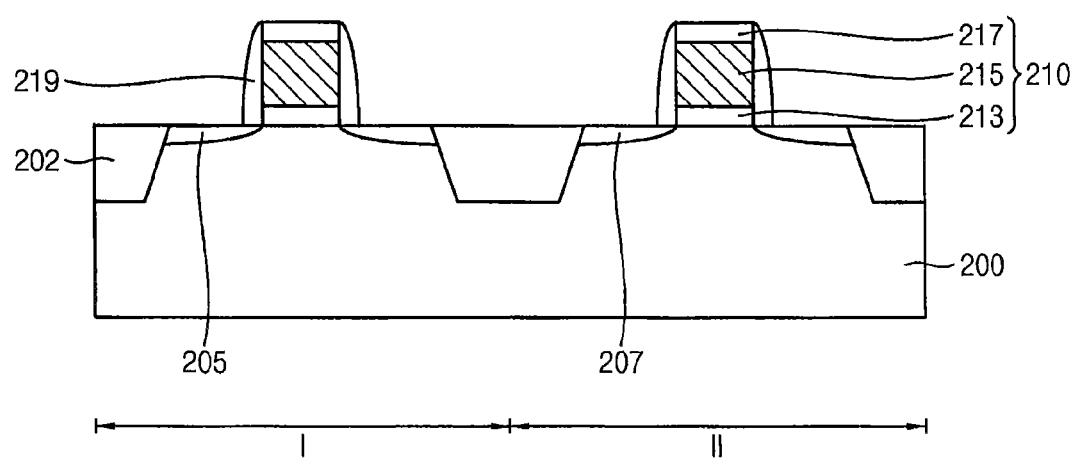

Referring to FIG. 24, a gate structure 210 may be formed on a substrate 200, and then impurity regions 205 and 207 may be formed at upper portions of the substrate 200 adjacent to the gate structure 210.

The substrate 200 may include a first region I and a second region II. For example, the first region I and the second region II may correspond to an n-channel metal oxide semiconductor (NMOS) region and p-channel metal oxide semiconductor (PMOS) region, respectively. In these embodiments, a p-type well and an n-type well may be formed at upper portions of the substrate 200 in the first region I and the second region II, respectively.

The substrate 200 may include a semiconductor substrate, for example, a silicon substrate, a germanium substrate, a silicon-germanium substrate, an SOI substrate, a GOI substrate, and the like. A group 3-group 5 (III-V) semiconductor substrate including, for example, a GaP substrate, a GaAs substrate or a GaSb substrate may be also used as the substrate 100.

An isolation layer 202 may be formed at upper portions of the substrate 200 by a shallow trench isolation (STI) process. The substrate 200 may be divided into an active region and a field region by the isolation layer 202.

In some embodiments, a gate insulation layer, a gate electrode layer and a gate mask layer may be sequentially formed on the substrate 200, and may be patterned by, for example, a photolithography process to form a gate structure 210 including a gate insulation layer pattern 213, a gate electrode 215 and a gate mask 217.

The gate insulation layer may be formed using silicon oxide or a metal oxide. In some embodiments, the gate insulation layer may be formed by performing a thermal oxidation process on the substrate 200. The gate electrode layer may be formed by doped polysilicon, a metal, a metal nitride or a metal silicide. The gate mask layer may be formed using silicon nitride. The gate insulation layer, the gate electrode layer and the gate mask layer may be formed by a CVD process, a PVD process, an ALD process or a spin coating process.

Impurities may be implanted using the gate structures 210 as an ion-implantation mask to form a first impurity region 205 and a second impurity region 207 at upper portions of the substrate 200 adjacent to the gate structures 210. The first and second impurity regions 205 and 207 may be formed on the first and second regions I and II, respectively. For example, the first impurity region 205 may include n-type impurities, such as phosphorus (P) or arsenic (As), and the second impurity region 207 may include p-type impurities, such as boron (B) or gallium (Ga).

In these embodiments, a first photoresist mask may be formed on the substrate 200 to cover the second region II, and the n-type impurities may be implanted to the first region II to form the first impurity region 205. The first photoresist mask may be removed by an ashing process and/or a strip process. A second photoresist mask may be formed on the substrate 200 to cover the first region I, and the p-type impurities may be implanted to the second region II to form the second impurity region 207. The second photoresist mask may be removed by an ashing process and/or a strip process.

Accordingly, an NMOS transistor may be defined by the first impurity region 205 and the gate structure 210 on the first region I, and a PMOS transistor may be defined by the second impurity region 207 and the gate structure 210 on the second region II. Thus, a complementary metal oxide semiconductor (CMPS) transistor may be formed on the substrate 200.

A gate spacer 219 may be formed on a sidewall of the gate structure 210. For example, a spacer layer covering the gate structure 210 may be formed on the substrate 200, and then the spacer layer may be anisotropically etched to form the gate spacer 219. The spacer layer may be formed using silicon nitride by a CVD process, a spin coating process, etc.

Figure 25:
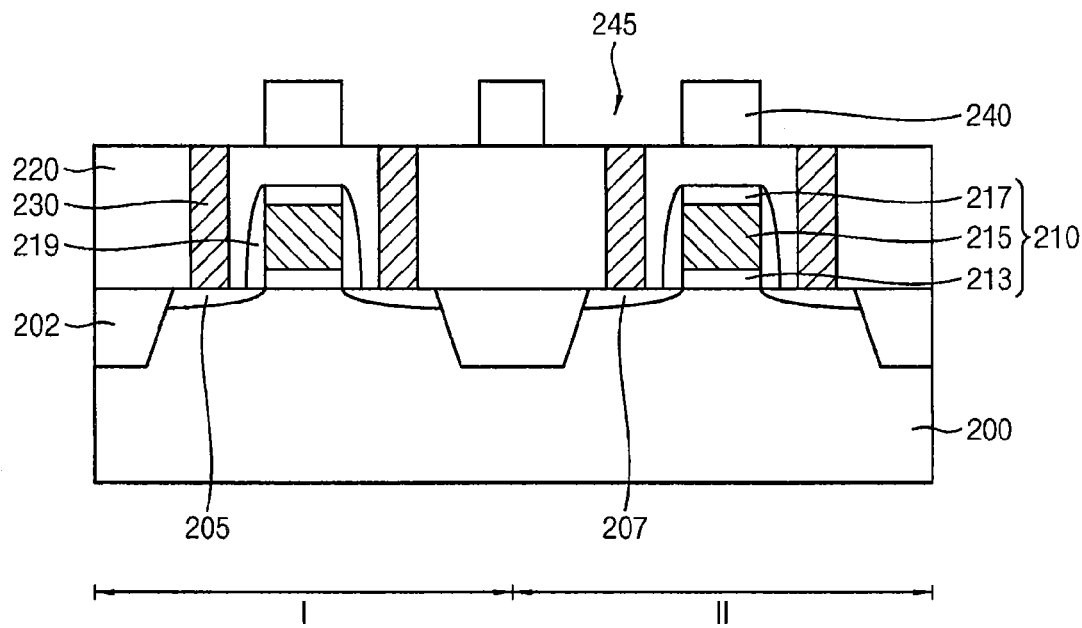

Referring to FIG. 25, a first insulating interlayer 220 covering the gate structure 210 may be formed on the substrate 200. First contacts 230 may be formed through the first insulating interlayer 220 to contact the first and second impurity regions 205 and 207. A first sacrificial layer 240 may be formed on the first insulating interlayer 220.

For example, the first insulating interlayer 220 may be formed using a low-k silicon oxide-based material by a CVD process or a spin coating process. The first insulating interlayer 220 may be partially etched to form first contact holes through which the first and second impurity regions 205 and 207 are exposed. A conductive layer sufficiently filling the first contact holes may be formed on the first insulating interlayer 220. The conductive layer may be planarized by a CMP process until a top surface of the first insulating interlayer 220 is exposed to form the first contacts 230, The conductive layer may be formed using a metal, a metal nitride or a metal silicide by an ALD process, a sputtering process, a PVD process, etc.

In some embodiments, the first contact 230 may be in contact with the gate spacer 219. In these embodiments, the gate spacer 219 may be exposed by the first contact hole, and the first contact hole and the first contact 230 may be self-aligned with the gate spacer 219.

The first sacrificial layer 240 may be formed using a material and a process substantially the same as or similar to those illustrated with reference to FIGS. 1 and 2. Accordingly, the first sacrificial layer 240 may be formed on a substantially entire surface of the first insulating interlayer 220, and may be partially etched to form a plurality of openings 245. A top surface of the first contact 230 may be exposed by the opening 245.

Figure 26:
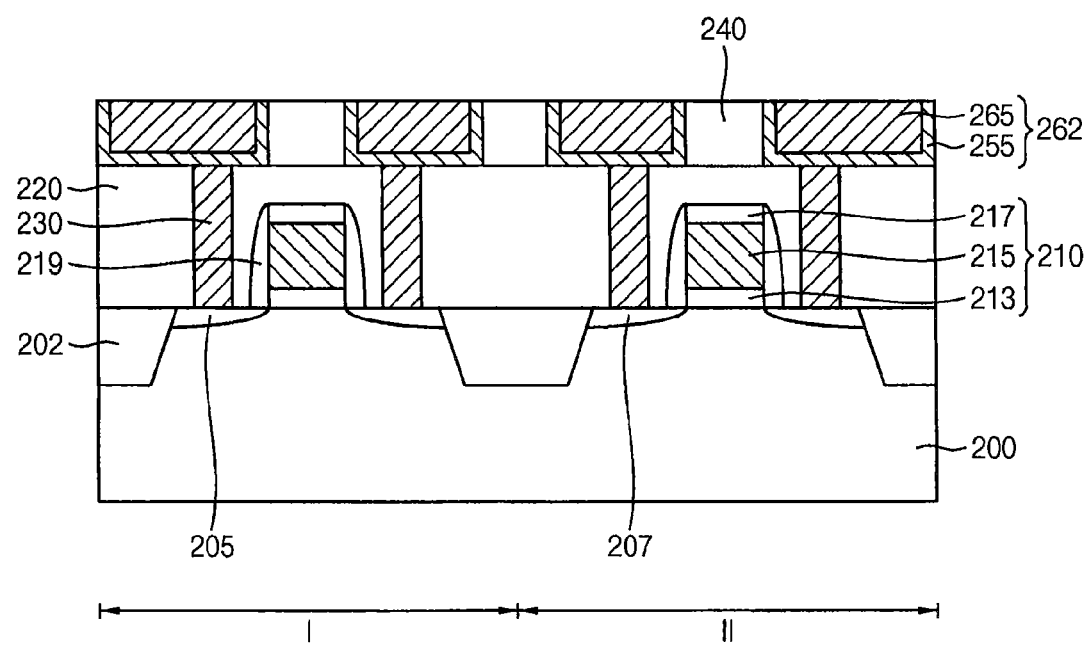

Referring to FIG. 26, processes substantially the same as or similar to those illustrated with reference to FIGS. 3 and 4 may be performed to form a first barrier conductive layer pattern 255 and a first conductive pattern 265 electrically connected to the first contact 230 in the opening 245. Accordingly, a first wiring pattern 262 including the first barrier conductive layer pattern 255 and the first conductive pattern 265 may be obtained.

Figure 27:
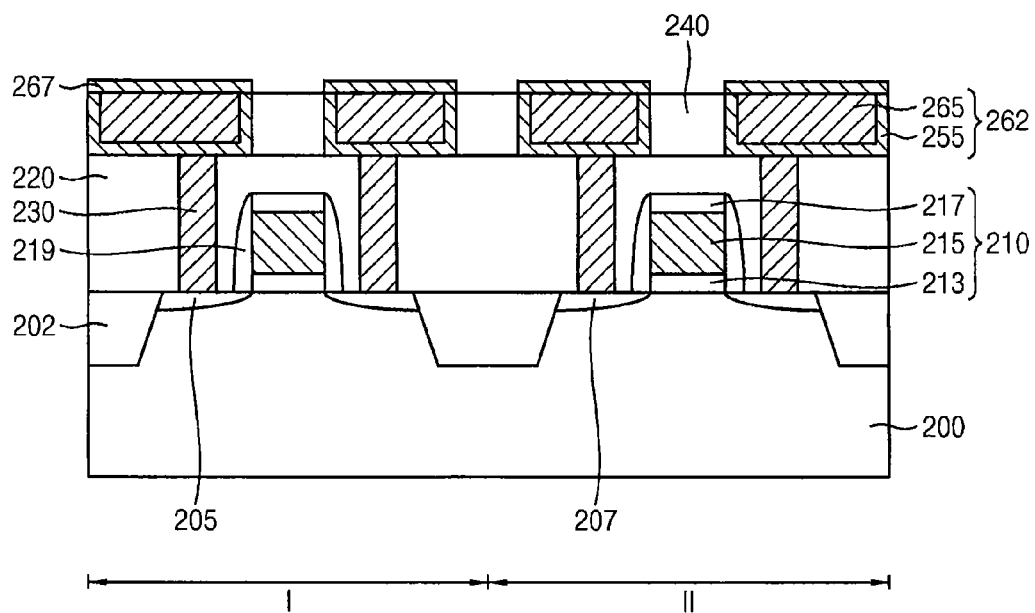

Referring to FIG. 27, a process substantially the same as or similar to that illustrated with reference to FIG. 5 may be performed to form a first capping layer pattern 267 on the first wiring pattern 262. In some embodiments, a process substantially the same as or similar to that illustrated with reference to FIG. 16 may be performed to form the first capping layer pattern. In some embodiments, processes substantially the same as or similar to those illustrated with reference to FIGS. 20 to 22 may be performed to form the first capping layer pattern.

Figure 28:
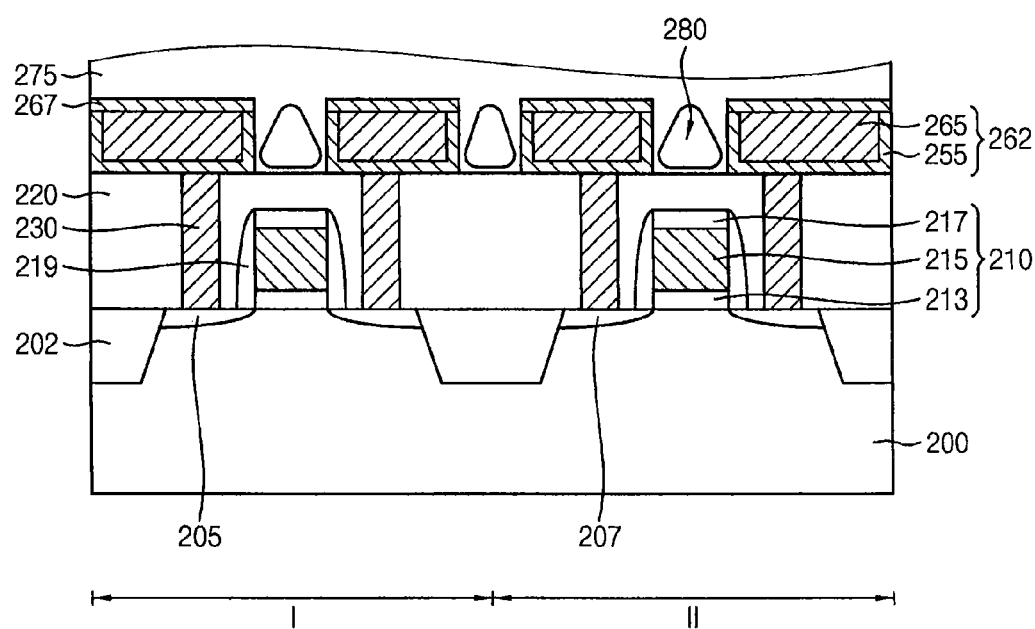

Referring to FIG. 28, processes substantially the same as or similar to those illustrated with reference to FIGS. 6 to 8 may be performed. Accordingly, the first sacrificial layer 240 may be removed by the plasma treatment and the wet etching process as described above, and a first insulation layer 275 covering the first wiring pattern 262 may be formed on the first insulating interlayer 220. A first air gap 280 may be formed in a portion of the first insulation layer 275 between the neighboring first wiring patterns 262. In some embodiments, the first sacrificial layer 240 may be removed by repeating a plurality of removal cycles as illustrated with reference to FIGS. 10 to 13.

Figure 29:
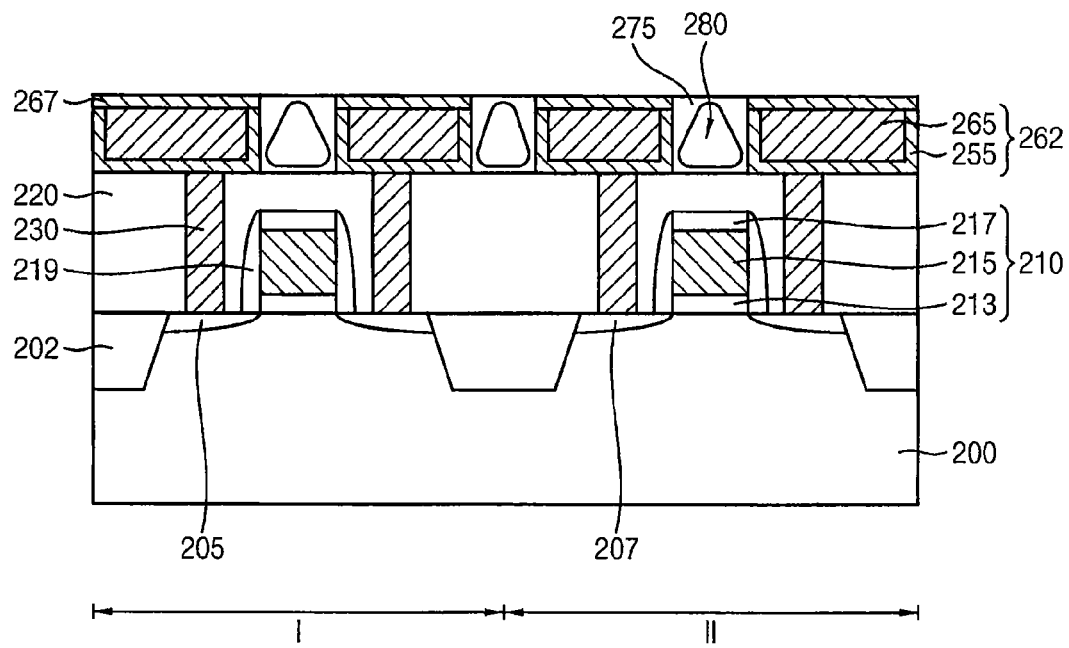

Referring to FIG. 29, an upper portion of the first insulation layer 275 may be planarized by a CMP process until a top surface of the first capping layer pattern 267 is exposed.

Figure 30:
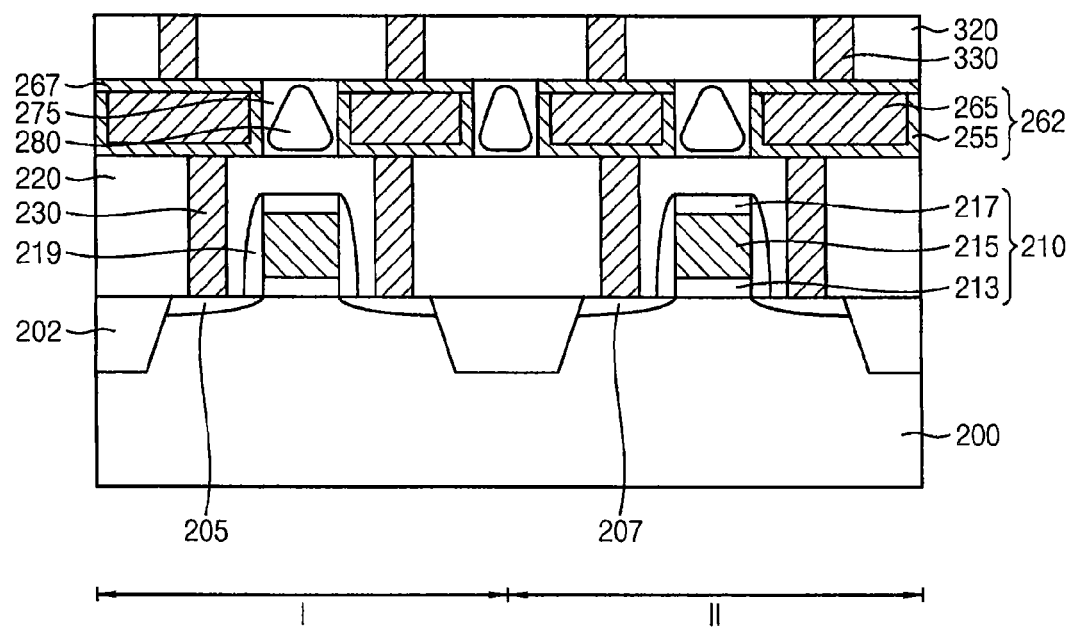

Referring to FIG. 30, a second insulating interlayer 320 may be formed on the first insulation layer 275 and the first capping layer pattern 267. A second contact 330 may be formed through the second insulating interlayer 320 to be electrically connected to the first wiring pattern 262.

The second insulating interlayer 320 and the second contact 330 may be formed by processes substantially the same as or similar to those for the first insulating interlayer 220 and the first contact 230.

Figure 31:
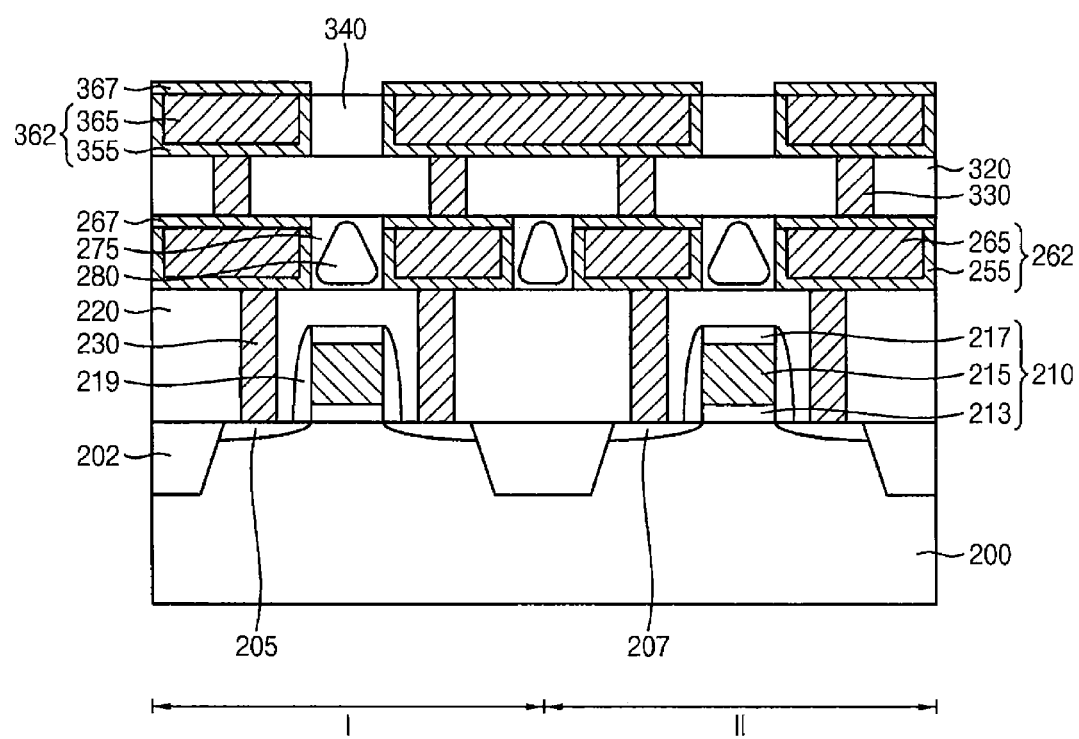

Referring to FIG. 31, processes substantially the same as or similar to those illustrated with reference to FIGS. 25 to 27 may be performed.

Accordingly, a second sacrificial layer 340 may be formed on the second insulating interlayer 320 and the second contact 330, and then partially removed to form an opening through which the second contact 330 is exposed. A second barrier conductive layer pattern 355 and a second conductive pattern 365 filling the opening may be formed to be electrically connected to the second contact 330. Thus, a second wiring pattern 362 including the second barrier conductive layer pattern 355 and the second conductive pattern 365 may be obtained. Additionally, a second capping layer pattern 368 may be formed on the second wiring pattern 362.

In some embodiments, at least one of a plurality of the second wiring patterns 362 may connect the transistors of the first region I and the second region II to each other. For example, the second wiring pattern 362 may include a wiring for transferring an electrical signal between the NMOS region and the PMOS region.

Figure 32:
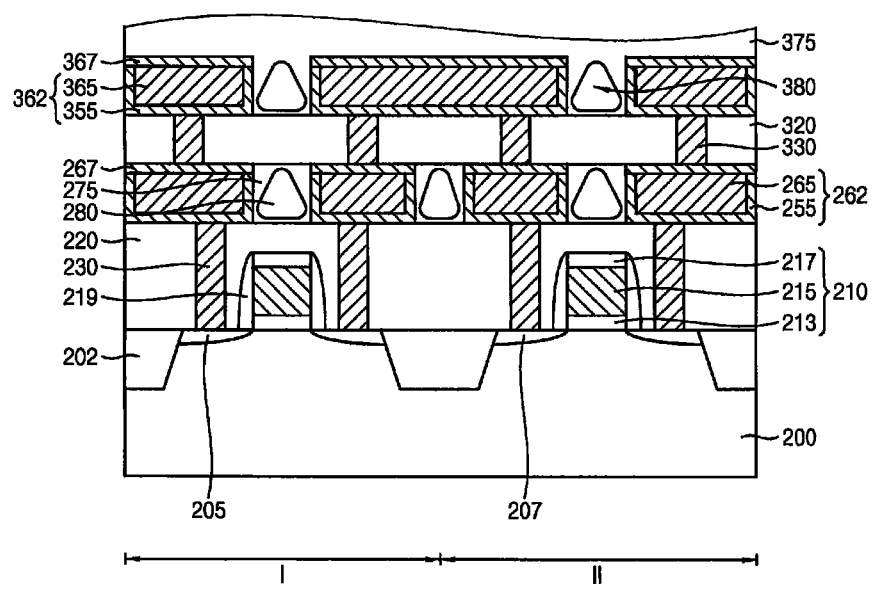

Referring to FIG. 32, processes substantially the same as or similar to those illustrated with reference to FIGS. 6 to 8 may be performed. Accordingly, the second sacrificial layer 340 may be removed by the plasma treatment and the wet etching process as described above, and a second insulation layer 375 covering the second wiring pattern 362 may be formed on the second insulating interlayer 320. A second air gap 380 may be formed in a portion of the second insulation layer 375 between the neighboring second wiring patterns 362.

In some embodiments, the second sacrificial layer 340 may be removed by repeating a plurality of removal cycles as illustrated with reference to FIGS. 10 to 13. An upper portion of the second insulation layer may be planarized by, for example, a CMP process. In some embodiments, additional wiring structures may be formed on the second insulation layer 375 and the second wiring pattern 362.

Processing steps for removing a sacrificial layer will now be discussed with reference to Examples and Comparative Examples.

Evaluation on a Uniformity of Removed Sacrificial Layers

A sacrificial layer was formed on a silicon substrate using TEOS. A plasma treatment was performed on the sacrificial layer using a mixture of $NH_3$ and $N_2$ as a reactive gas at a temperature of 350° C. for 120 seconds, and then the sacrificial layer was partially removed by a wet etching process using a diluted HF solution.

A non-uniformity (NU) of the remaining sacrificial layer was measured. The NU was calculated by measuring a height difference between the highest point and the lowest point of a top surface of the remaining sacrificial layer. The NU is substantially proportional to the height difference.

The NU and an etching rate of the sacrificial layer were repeatedly measured varying an RF power and a pressure condition of the plasma treatment. Specifically, the sacrificial layer was partially removed by a dual power plasma treatment using both an HF power and an LF power, and then the NU and the etching rate of the sacrificial layer were measured (Comparative Examples). The sacrificial layer was partially removed by a single HF power plasma treatment, and then the NU and the etching rate of the sacrificial layer were measured (Examples). The results are shown in Table 1 below.

TABLE 1

|  | Pressure (Torr) | RF power (W/mm2) (HF/LF) | NU (%) | Etching Rate (Å/sec) |
|---|---|---|---|---|
| Comparative Example 1 | 1.7 | 0.008/0.003 | 11.64 | 62 |
| Comparative Example 2 | 2.4 | 0.008/0.003 | 10.39 | 67 |
| Comparative Example 3 | 2.4 | 0.012/0.003 | 16.81 | 43 |
| Comparative Example 4 | 1.7 | 0.008/0.003 | 10.01 | 42 |
| Comparative Example 5 | 1.7 | 0.012/0.003 | 11.91 | 48 |
| Comparative Example 6 | 2.4 | 0.012/0.003 | 10.47 | 49 |
| Comparative Example 7 | 2.4 | 0.008/0.003 | 29.15 | 56 |
| Example 1 | 2.4 | 0.02 | 5.72 | 89 |
| Example 2 | 4.2 | 0.012 | 6.34 | 62 |
| Example 3 | 2.4 | 0.007 | 4.50 | 95 |
| Example 4 | 2.4 | 0.006 | 9.60 | 72 |
| Example 5 | 2.4 | 0.004 | 5.4 | 88 |
| Example 6 | 1.7 | 0.003 | 14.01 | 78 |
| Example 7 | 5.2 | 0.002 | 11.23 | 56 |
| Example 8 | 2.4 | 0.03 | 12.31 | 89 |
| Example 9 | 0.8 | 0.02 | 11.35 | 92 |

Referring to Table 1, the NU values of the examples implementing the single HF power plasma treatment were generally low relative to those of the comparative examples implementing the dual power plasma treatment. Specifically, the NU values of examples 1 to 5 were lower than 10. Furthermore, the etching rates of the examples were entirely greater than those of the comparative examples.

Referring to examples 6 and 7, when the single HF power was reduced to less than about 0.004 W/mm$^2$, the NU values were increased to greater than 10%. Specifically, when the pressure in a process chamber was increased to greater than about 5 torr, the etching rate was decreased compared to those of the other Examples. In example 9, when the pressure in the process chamber was reduced to less than 1 torr, the NU value was increased to greater than 10% due to an excessively increased plasma collision rate.

Referring to example 8, when the single HF power was greater than 0.02 W/mm$^2$, the NU value was increased to greater than 10%.

Therefore, the sacrificial layer may be uniformly removed by a plasma treatment using a single power in a suitable range, so that an air gap having a uniform shape may be formed in a space from which the sacrificial layer is removed.

Methods according to some embodiments may be utilized for reducing an interference and a crosstalk caused by a parasitic capacitance in wiring structures and semiconductor devices having a small pitch and a high degree of integration.

Thus, semiconductor devices having an improved reliability such as a dynamic random access memory (DRAM) device, an NAND flash device, a magnetic random access memory (MRAM) device, a resistive random access memory (ReRAM) device, and the like, may be manufactured utilizing the methods according to some embodiments.

The foregoing is illustrative of some embodiments and is not to be construed as limiting thereof. Although a few some embodiments have been described, those skilled in the art will readily appreciate that many modifications are possible in the some embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various some embodiments and is not to be construed as limited to the specific some embodiments disclosed, and that modifications to the disclosed some embodiments, as well as other some embodiments, are intended to be included within the scope of the appended claims.

What is claimed is:

1. A method of forming a wiring structure, comprising:
    forming an insulating interlayer on a substrate;
    forming a sacrificial layer on the insulating interlayer;
    partially removing the sacrificial layer to provide a plurality of openings exposing the insulating interlayer;
    forming wiring patterns in the openings;
    performing a plasma treatment on the sacrificial layer to provide a modified sacrificial layer;
    removing the modified sacrificial layer by wet etching the modified sacrificial layer; and
    forming an insulation layer on the wiring patterns and the insulating interlayer, the insulation layer defining an air gap therein between neighboring wiring patterns.

2. The method of claim 1, wherein forming the sacrificial layer comprises forming the sacrificial layer using silicon oxide that includes hydrocarbon groups.

3. The method of claim 2, wherein forming the sacrificial layer comprises forming the sacrificial layer using one of a tetraethyl orthosilicate (TEOS)-based silicon oxide and polysiloxane including alkyl substituents.

4. The method of claim 2, wherein the modified sacrificial layer has a hydrogen content greater than a hydrogen content of the sacrificial layer.

5. The method of claim 2, wherein the modified sacrificial layer has a hydrophilicity greater than a hydrophilicity of the sacrificial layer.

6. The method of claim 1, wherein performing the plasma treatment comprises performing the plasma treatment using a reactive gas that includes at least one of ammonia ($NH_3$), nitrogen ($N_2$) and hydrogen ($H_2$).

7. The method of claim 1, wherein performing the plasma treatment comprises applying a single high frequency (HF) power.

8. The method of claim 7, wherein the single HF power range is from about 0.004 W/mm$^2$ to about 0.02 W/mm$^2$.

9. The method of claim 7, wherein performing the plasma treatment comprises performing the plasma treatment at a pressure from about 1 torr to about 5 torr.

10. The method of claim 1, further comprising repeating performing the plasma treatment and removing the modified sacrificial layer for a plurality of cycles.

11. The method of claim 1, further comprising forming a capping layer pattern on the wiring pattern.

12. The method of claim 11, wherein forming the capping layer pattern comprises:

forming a capping layer on the sacrificial layer and the wiring patterns; and partially removing the capping layer to form the capping layer pattern, wherein the capping layer pattern has a width greater than a width of the wiring pattern.

13. The method of claim 11, wherein forming the capping layer pattern includes:

partially removing an upper portion of the wiring pattern to define a recess;

forming a capping layer filling the recess on the sacrificial layer; and planarizing an upper portion of the capping layer.

14. The method of claim 1, wherein forming the wiring patterns includes:

forming a barrier conductive layer on the sacrificial layer and sidewalls and bottoms of the openings;

forming a conductive layer filling the openings on the barrier conductive layer; and planarizing upper portions of the conductive layer and the barrier conductive layer to form a conductive pattern and a barrier conductive layer pattern.

15. A method of fabricating a semiconductor device, comprising:

providing a transistor on a substrate;

forming an insulating interlayer on the transistor;

forming contacts through the insulating interlayer to be electrically connected to the transistor;

forming a sacrificial layer on the insulating interlayer;

partially removing the sacrificial layer to define a plurality of openings in the sacrificial layer;

forming wiring patterns in the openings;

performing a reductive plasma treatment on the sacrificial layer to provide a modified sacrificial layer;

removing the modified sacrificial layer using a wet etching process; and forming an insulation layer on the wiring patterns, the insulation layer defining an air gap therein between neighboring wiring patterns.

16. The method of claim 15, wherein performing the plasma treatment comprises performing the plasma treatment using a single high frequency power that ranges from about 0.004 W/mm$^2$ to about 0.02 W/mm$^2$.

17. A method of forming a wiring structure, comprising:

forming an insulating interlayer on a substrate;

forming a sacrificial layer on the insulating interlayer having a plurality of openings therein that expose at least a portion of the insulating interlayer;

forming wiring patterns in the openings;

performing a plasma treatment on the sacrificial layer;

removing portions of the sacrificial layer between wiring patterns by a wet etching process;

forming an insulation layer between spaces in the wiring patterns resulting from the removal of the sacrificial layer, and repeating performing the plasma treatment and removing the portions of the sacrificial layer for a plurality of cycles.

18. The method of claim 17, wherein performing a plasma treatment on the sacrificial layer comprises transforming the sacrificial layer into a modified sacrificial layer, wherein the insulation layer defines an air gap therein between the wiring patterns.

19. The method of claim 18, wherein performing the plasma treatment comprises performing the plasma treatment using a single high frequency (HF) power.

20. The method of claim 19, wherein the single HF power range is from about 0.004 W/mm$^2$ to about 0.02 W/mm$^2$.

* * * * *